(12) United States Patent
Döllgast

(10) Patent No.: US 7,045,933 B2
(45) Date of Patent: May 16, 2006

(54) FLAT ACTUATOR OR SENSOR WITH INTERNAL PRESTRESS

(75) Inventor: Bernhard Döllgast, Erlangen (DE)

(73) Assignee: Caterpillar Inc, Peoria, IL (US)

( * ) Notice: Subject to any disclaimer, the term of this patent is extended or adjusted under 35 U.S.C. 154(b) by 0 days.

(21) Appl. No.: 10/080,362

(22) Filed: Feb. 21, 2002

(65) Prior Publication Data

US 2003/0048040 A1    Mar. 13, 2003

Related U.S. Application Data

(63) Continuation-in-part of application No. 10/026,496, filed on Dec. 19, 2001, now abandoned.

(30) Foreign Application Priority Data

Sep. 7, 2001    (DE) ................. 101 44 182

(51) Int. Cl.
  *H01L 41/08*    (2006.01)

(52) U.S. Cl. ............... 310/328; 310/324; 310/334; 310/339

(58) Field of Classification Search ........... 310/325, 310/307, 378, 330–332, 363, 367, 323.07, 310/321, 328, 324, 340, 346, 338, 339
See application file for complete search history.

(56) References Cited

U.S. PATENT DOCUMENTS

| | | | | |
|---|---|---|---|---|
| 2,836,738 A | * | 5/1958 | Crownover | 310/328 |
| 3,437,849 A | * | 4/1969 | Treatch et al. | 310/319 |
| 3,683,211 A | * | 8/1972 | Perlman et al. | 310/326 |
| 3,916,348 A | * | 10/1975 | Toda et al. | 333/155 |
| 4,078,160 A | * | 3/1978 | Bost | 381/190 |
| 4,349,762 A | * | 9/1982 | Kitamura et al. | 310/332 |
| 4,541,731 A | * | 9/1985 | Bell et al. | 374/117 |
| 5,148,076 A | * | 9/1992 | Albers et al. | 310/323.17 |
| 5,231,326 A | * | 7/1993 | Echols | 310/339 |
| 5,376,860 A | * | 12/1994 | Sato | 310/346 |
| 5,471,721 A | | 12/1995 | Haertling | |
| 5,481,184 A | | 1/1996 | Jacobsen | |
| 5,632,841 A | * | 5/1997 | Hellbaum et al. | 156/245 |
| 5,831,371 A | * | 11/1998 | Bishop | 310/328 |
| 5,849,125 A | | 12/1998 | Clark | |
| 6,030,480 A | | 2/2000 | Face, Jr. et al. | |
| 6,060,811 A | | 5/2000 | Fox et al. | |
| 6,140,745 A | | 10/2000 | Bryant | |
| 6,153,966 A | * | 11/2000 | Neukermans | 310/328 |
| 6,213,564 B1 | * | 4/2001 | Face, Jr. | 303/3 |
| 6,392,329 B1 | * | 5/2002 | Bryant et al. | 310/328 |
| 6,552,474 B1 | * | 4/2003 | Takeuchi et al. | 310/330 |
| 6,557,986 B1 | * | 5/2003 | Watanabe et al. | 347/70 |

FOREIGN PATENT DOCUMENTS

| | | |
|---|---|---|
| DE | 197 32 513 A1 | 2/1999 |
| DE | 199 20 576 C1 | 6/2000 |
| DE | 199 48 359 A1 | 1/2001 |

(Continued)

*Primary Examiner*—Mark Budd
(74) *Attorney, Agent, or Firm*—Lerner and Greenberg, P.A.

(57) ABSTRACT

A flat multilayered component for use as an actuator or a sensor, is described. The flat multilayered component contains a layer of electrically activatable material, a passive middle layer disposed adjacent the layer of electrically activatable material, and a further passive material layer disposed adjacent the passive middle layer. The passive middle layer has a higher coefficient of linear thermal expansion than both of the layer of electrically activatable material and the further passive middle layer.

19 Claims, 2 Drawing Sheets

FOREIGN PATENT DOCUMENTS

| | | |
|---|---|---|
| DE | 100 08 752 A1 | 9/2001 |
| DE | 101 11 502 A1 | 10/2001 |
| DE | 100 23 556 A1 | 11/2001 |
| JP | 61 295 025 A | 12/1986 |

* cited by examiner

FLAT ACTUATOR OR SENSOR WITH INTERNAL PRESTRESS

CROSS-REFERENCE TO RELATED APPLICATION

This is a continuation-in-part application of U.S. application Ser. No. 10/026,496, filed on Dec. 19, 2001 now abandoned.

BACKGROUND OF THE INVENTION

Field of the Invention

The invention relates to a flat multilayer, in particular thermally-compensated, and electrically actuable component with internal prestress for use as an actuator or sensor.

Flat actuators and sensors are known under the name bimorph or bending transducer. They usually contain two active layers that are joined together, in particular made from ceramic based on lead zirconate titanate. The middle layer used may be an inert material, for example a metal or a fiber-reinforced plastic. If a layer is activated in such a manner that its length is shortened, and if, at the same time, the other layer is not activated or is lengthened as a result of the actuation, bending of the overall composite takes place on account of the intimate bond between the layers. Since the configuration is symmetrical with respect to the middle layer, differences in thermal expansion cancel one another out and the composite does not change shape as the temperature changes.

U.S. Pat. Nos. 5,632,841 and 6,060,811 describes an asymmetric, curved configuration in which a flat composite containing a metal and an active ceramic, in particular a piezoceramic based on lead zirconate titanate, is prestressed by the differences in thermal expansion. The composite is bonded at a high temperature. After solidification of the polymer used for bonding, mechanical stresses are formed in the ceramic and in the metal on account of their differences in expansion coefficient, so that the ceramic is placed under pressure.

In a production process which is known from U.S. Pat. No. 5,632,841 a two-layer composite is made into a curved shape by an additional mold with bent surface, heating with subsequent cooling inducing a prestress.

U.S. Pat. No. 6,060,811 describes a curved element of laminated structure, in which the individual constituents, which are prestressed by its curvature, are joined to one another using the method which is known from U.S. Pat. No. 5,632,841.

U.S. Pat. No. 5,849,125 describes a method for manufacturing a curved, electrically activatable composite element, in which curved elements are joined, in a mold which is likewise curved, under pressure and at a defined temperature.

U.S. Pat. No. 6,030,480 discloses a flat component containing a ceramic and up to three metal layers. A metal layer which is provided between the ceramic and a metal support formed of steel and which is larger than the metal support, is used to fix the layer structure of the composite in a press.

U.S. Pat. No. 5,471,721 describes an actuator which has an inner layer structure produced by partial chemical reduction, the reduced layer fulfilling the function of the metal in other configurations, as a "rainbow".

The common advantage of the known constructions is that the thermal prestressing increases the effectiveness of the ceramic and its resistance to fracturing, since it is acted on by a compressive stress. However, a drawback of the configurations is that the differences in thermal expansion lead to a change in shape not only in the event of electrical actuation but also in the event of a change in the ambient temperature. The change is of the same order of magnitude as the change in shape caused by electrical actuation.

Consequently, either the temperature range within which the components or transducers can be used is greatly restricted, or additional compensation measures are required.

SUMMARY OF THE INVENTION

It is accordingly an object of the invention to provide a flat actuator or a sensor with internal prestress which overcomes the above-mentioned disadvantages of the prior art devices of this general type, which has a simple structure and an internal prestress, in particular corresponding to an asymmetric element.

With the foregoing and other objects in view there is provided, in accordance with the invention, a flat multilayered component for use as an actuator or sensor. The flat multilayered component contains a layer of electrically activatable material, a passive middle layer disposed adjacent the layer of electrically activatable material, and a further passive material layer disposed adjacent the passive middle layer. The passive middle layer has a higher coefficient of linear thermal expansion than both of the layer of electrically activatable material and the further passive middle layer.

For this purpose, the flat multilayer component is provided for use as an actuator or sensor. The component is formed of the layer of electrically activatable material and an advantageously passive middle layer made from a material with a coefficient of thermal expansion which is high compared to that of the activatable material layer, as well as a further, likewise passive material layer. The coefficient of linear thermal expansion of the further passive material layer is at least approximately similar to the expansion coefficient of the activatable material layer. The electrically activatable material layer is preferably a piezoceramic.

The configuration allows the change in the shape of the component as the temperature changes to be set in a defined way. This property is particularly advantageous for the intended application of the component, since changes in the environment, for example in a housing which accommodates the component, can be compensated for by the influence of the ambient temperature. A further advantage consists in being able to influence the shape of the component at room temperature by changing the process parameters.

The two non-active (passive) layers, namely the middle layer and the further material layer, are preferably a metallic composite element, in particular a thermal bimetallic strip, produced by rolling or some other industrial process.

The result of the configuration with one activatable layer and two passive layers is that the composite formed therefrom is of symmetrical structure in terms of the thermal expansion. A further layer of metal, the thickness of which is very thin compared to the other layers, may be disposed on the free surface of the active or activatable material layer, as an additional electrode.

According to the invention, a component of this type is produced by the assembly, in order to be joined, being heated between two substantially planar plates, to a temperature which is higher than the softening temperature of an adhesive. In the process, pressure is applied orthogonally to the main plane of the assembly, the assembly being cooled to below the softening temperature under pressure.

If a solid composite of the two metals with different coefficients of thermal expansion is used as the passive layer, at least partial plastic deformation of the passive layer takes place during the heating of the composite under pressure. The internal stress situation, which is changed as a result, leads to a change in the static stress situation and therefore in the shape of the component. This allows the production of a flat, planar component.

The dimensioning of the layers and the selection of materials can be worked out by engineering technology, in particular by analogy with the calculation of the thermal bimetallic strips. Calculation examples are to be found, inter alia, in the explanation of the laminate group theory given by Timoshenko, "Analysis of Bi-metal Thermostats", Journal of Optical Society of America, Vol. 2, pp. 233–255, 1925, and the expanded laminate group theory according to Arndt Stephan "Thermische Verformung von unsymmetrischen Mehrschichtverbundwerkstoffen" [Thermal Deformation Of Asymmetric Multilayer Composites], VDI-Reihe 2, no. 500, Düsseldorf (DE) 1999.

If the material selected for the further layer is a metal, it can be adhesively bonded to the middle layer. However, it is more advantageous to use a metallic bond, in particular produced by rolling, since a composite metal of this type is advantageously obtainable as a finished product (thermal bimetallic strip). The use of a thermal bimetallic strip of this type in particular represents a considerable simplification during production.

Another possible configuration is for electrically conductive fibers in a plastic matrix to be used as the middle layer. The use of fibers as the additional material layer is also possible, if not—on account of compressive loads—necessarily optimal.

In a further possible configuration, a nonmetallic material with a low coefficient of thermal expansion, for example aluminum oxide, is used as the outer, inactive material layer.

In accordance with an added feature of the invention, the layer of electrically activatable material has a structure formed of a plurality of sub-layers.

In accordance with another feature of the invention, the layer of electrically activatable material is formed of a piezoceramic having at least one surface and a metal layer at least partially coating the surface of the piezoceramic.

With the foregoing and other objects in view there is provided, in accordance with the invention, a process for producing a flat multilayered component. The process includes providing an assembly having a layer of electrically activatable material, a passive middle layer disposed adjacent the layer of electrically activatable material, and a further passive material layer disposed adjacent the passive middle layer. The passive middle layer has a higher coefficient of linear thermal expansion than both of the layer of elecrically activatable material and the further passive middle layer. The assembly is heated between two substantially planar plates to a temperature that is higher than a softening temperature of an adhesive for joining components of the assembly. A pressure is applied orthogonally to a main plane of the assembly. The assembly is cooled to below the softening temperature under an influence of the pressure.

In accordance with a further mode of the invention, there area the steps of providing the further passive material layer and the passive middle layer as a metallic composite element; and selecting the temperature such that the metallic composite element is plastically deformed by an internal stress which is produced.

Other features which are considered as characteristic for the invention are set forth in the appended claims.

Although the invention is illustrated and described herein as embodied in a flat actuator or a sensor with internal prestress, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
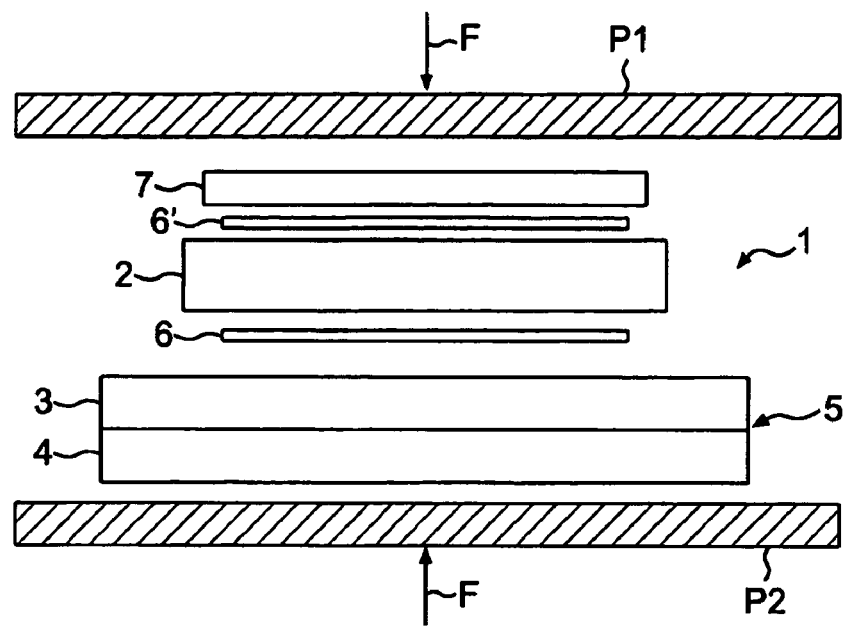
FIG. 1 is a diagrammatic, sectional view through a three-layer component according to the invention with an additional electrode layer in an unbonded state.

In all the figures of the drawing, sub-features and integral parts that correspond to one another bear the same reference symbol in each case. Referring now to the figures of the drawing in detail and first, particularly, to FIG. 1 thereof, there is shown a production of a component or composite element 1, which is referred to below as an assembly, and takes place by joining under pressure F and temperature. For this purpose, materials in the form of a ceramic 2 and a middle layer 3, as well as an additional material 4, if the middle layer 3 and the additional material 4 have not already been joined to one another by other methods to form a composite material 5, are coated with an adhesive 6. A further material or metal layer 7 can be disposed on that free surface of the ceramic 2, functioning as an active material layer, which is remote from the composite material 5 by an adhesive 6', as an additional electrode.

The ceramic 2 is a small plate that is formed of an electrically activatable material, for example piezo-electric, electrostrictive or magnetostrictive material. It is preferable to use a piezoceramic based on lead zirconate titanate (PZT). The ceramic 2 may, on at least one of the large surfaces 2a, 2b, be provided—according to the need to actuate an electroactive material—with a metal layer 9. This can be applied by sputtering or vapor deposition, screen printing or other methods.

A further possibility is to use a multi-layered component as the activatable layer. These elements, which are known in the prior art as multi-layered elements, have an inner structure containing a plurality of thin films of activatable material with electrodes between them. The electrodes may lie in the plane of the activatable layer, using the longitudinal effect, or transversely thereto, using the thickness effect. The composite 1, which is formed from the ceramic 2, the middle layer 3 and the additional material 4—or the composite material 5—and, if appropriate, the additional metal layer 7, including the adhesives 6, 6', in order to be joined, is heated, between two substantially planar plates P1 and P2, to a temperature which is higher than the softening temperature of the adhesives 6, 6'. In the process, a compressive force F is applied orthogonally to the main plane of the assembly 1. Then, the assembly 1 is cooled to below the softening or reaction temperature, under the pressure F.

The passive or inactive middle layer 3 has a higher coefficient of linear thermal expansion than the materials of the two adjacent layers, i.e. the active ceramic 2, on the one hand, and the further, passive or inactive material layer 4, on the other hand. Particularly suitable adhesives 6, 6' are thermoplastics (e.g. polyimides) or thermosets (e.g. epoxy resins) that have not yet cured, with a softening or reaction temperature that is as high as possible. Other methods for joining sheet-like elements (e.g. soldering) are likewise possible.

It is also possible for a flexible layer to be inserted between the plate P1 and the ceramic 2, in order to compensate for any differences in the thickness of the assembly 1. Using a commercially available thermobimetallic strip as the composite material 5 has the manufacturing technological advantage that the composite material or substrate 5 bends considerably when the assembly 1 is heated prior to the application of the compressive force or the pressure F. The sagging can be reduced by prior bending of the substrate 5. At any rate, only the substrate 5, but not the ceramic 2, is bent.

Figure 2:
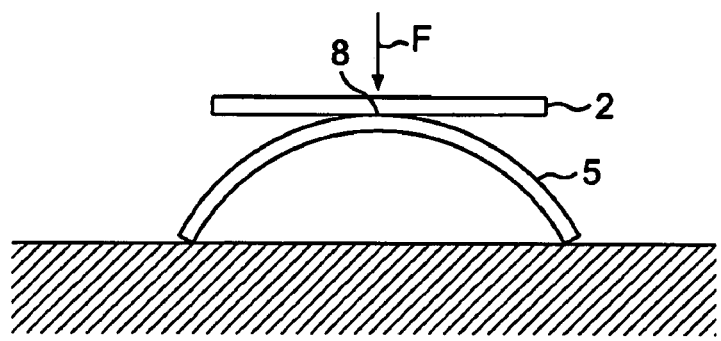
FIG. 2 diagrammatically depicts a manufacturing step with a passive composite material having been curved as a result of heating and with an active material layer bearing against it.

As indicated in FIG. 2, the curvature of the composite material 5 leads to the activatable material layer or ceramic 2 resting on the middle layer 3 and therefore on the composite material 5 which contains the middle layer 3 and the further material layer 4 only at a linear contact location 8. When the pressure F is then applied, the composite material 5 is pressed flat, so that the ceramic 2 is joined to the middle layer 3 formed by the corresponding layer of the composite metal 5 as if it were being rolled up. In this way, a very uniform bonding within the composite 1 is achieved.

When the pressure F is applied and the adhesive 6, 6' melts or reacts, the stress state that prevails at a correspondingly high temperature is frozen in place. Since the materials 2, 3, 4 can no longer move with respect to one another during the further cooling, the internal stresses, on account of the different coefficients of thermal expansion of the materials 2, 3, 4, lead to the desired mechanical prestress. This may involve partial plastic deformation of individual layers, in particular of the middle layer 3, which is under tensile stress, and of the additional electrode layer 7.

Therefore, in the composite 1 according to the invention, an additional material layer 4 is provided. The thickness, modulus of elasticity and thermal expansion of the additional material layer 4, which is expediently applied to the side which is remote from the ceramic 2, are adapted to the middle layer 3, which acts as a substrate metal, and the ceramic 2 in such a manner that changing the temperature induces a mechanical stress which eliminates the bending or sets it to a level which is desired both in terms of its magnitude and in terms of its direction. The then symmetrical build-up of the internal stresses results in that there is no bending to the outside, even if the ceramic 2, the metal 3 and the additional material layer 4 are under mechanical stress.

In practice, it is necessary for the coefficient of thermal expansion of the substrate metal and therefore of the middle layer 3 to be higher than the coefficient of thermal expansion of both the ceramic 2 and the additional material of the material layer 4. The thickness of the ceramic 2 and of the middle layer 3, and also of the additional material 4 and of the additional electrode layer 7, can be selected in such a manner, on the basis of their moduli of elasticity and their coefficients of thermal expansion, that for a given temperature difference in the ceramic 2 and in the material layer 4 the same mechanical expansion occurs and therefore there is no bending of the assembly 1 toward the outside.

The materials which form the actual substrate of the ceramic layer 2, i.e. the middle layer 3 and the additional material 4, are expediently a composite metal or a bimetallic strip, i.e. are joined together in the manner of a bimetallic strip or are rolled onto one another.

Figure 3:
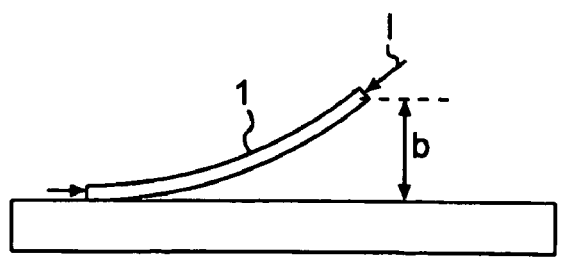
FIG. 3 diagrammatically depicts a configuration for measuring the deviation of different components.

The results of a measurement and analysis of the properties of various components are described and explained below with reference to FIGS. 3 and 4.

In a first example, the components or composite elements 1 were produced with dimensions of 37 mm×13 mm×0.4 mm (length, width, thickness). In the process, a commercially available ceramic 2 (PI Ceramic, PIC 255) with a thickness of 0.2 mm was adhesively bonded to a thermobimetallic strip 5 (TP 155/78, Aurhammer Metallwerke) with a thickness of 0.2 mm.

Figure 4:
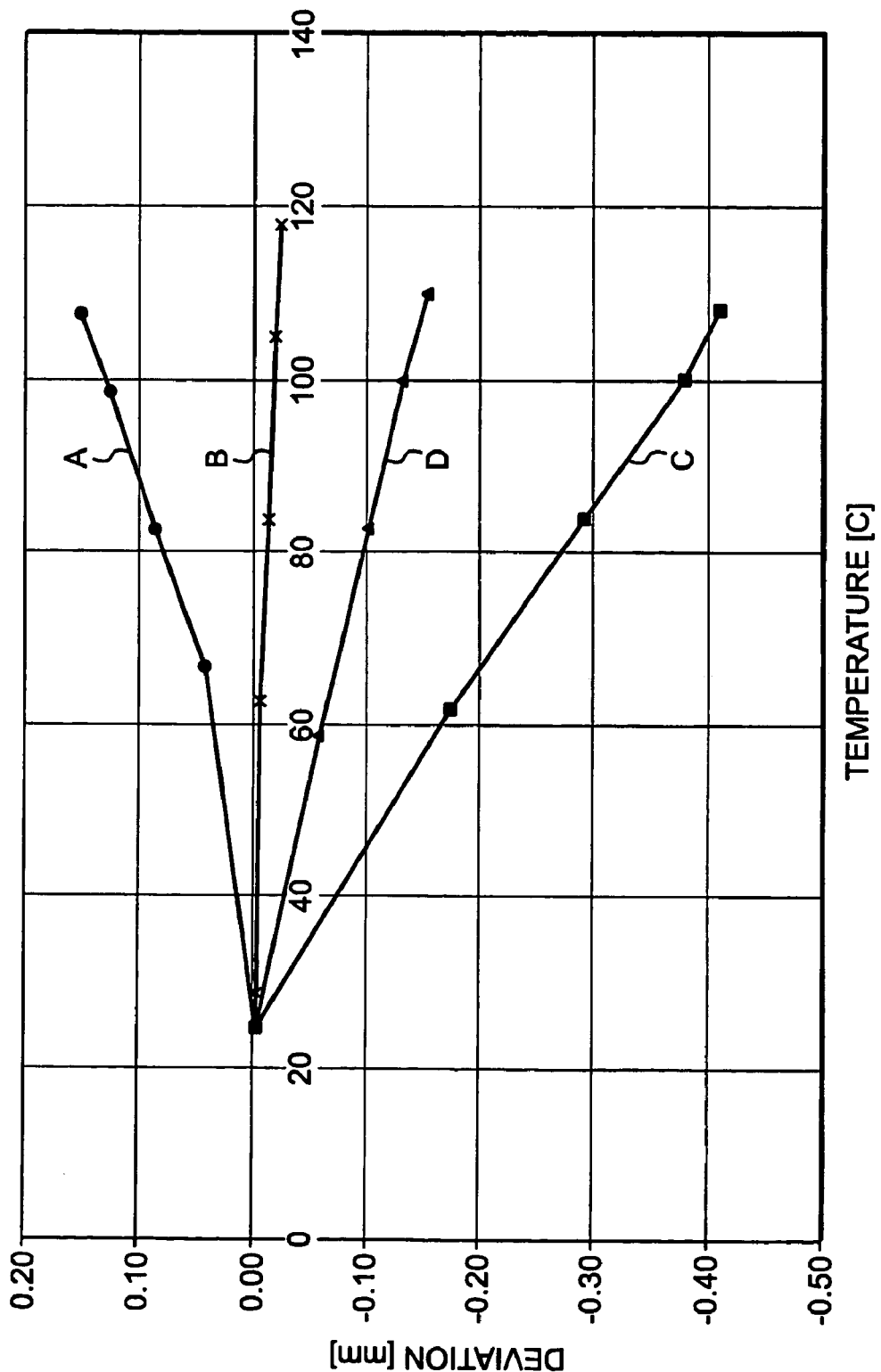
FIG. 4 is a graph depicting a temperature/deviation diagram illustrating different deviations as a function of the temperature.

The result of a measurement of a change in shape produced by temperature is illustrated by line A in FIG. 4. For this purpose, a measurement structure as shown in FIG. 3 is produced, in which the composite element 1 including the thermal bimetallic strip 5 is resting on two supports 10 and 11. To facilitate comparison, the gap width a between the supports 10 and 11 was kept constant in all examples at a value of a=30 mm. The deviation b was measured in the center between the two supports 10, 11, starting at room temperature. A deviation or change b in the curvature in the upward direction is—in the direction of arrow R—plotted as positive.

In a second example, the component or composite element 1 with dimensions of 62 mm×15 mm×0.65 mm were produced from the same materials, with the ceramic 2 with a thickness of 0.45 mm. The result of measuring the change in shape caused by the temperature is plotted in FIG. 4 by the line B. For comparison purposes, components having the same ceramics 2 in thicknesses of 0.2 mm and 0.45 mm were adhesively bonded to a steel 1.4310 with a thickness of 0.20 mm, so that these elements correspond to the description given in U.S. Pat. Nos. 5,632,841 and 6,060,811. In the text that follows, these elements are described as "conventional elements". In addition, an aluminum foil 9 with a thickness of 10 μm was adhesively bonded to the ceramic 2. The adhesive bonding 6, 6' took place using a polyimide with a softening temperature $T_g$ of 260° C. The result of a measurement of the change in shape caused by the temperature is plotted in FIG. 4 by the line C for the ceramic 2 of thickness 0.2 mm and by the curve D for the ceramic 2 of thickness 0.45 mm.

Theoretical calculations demonstrate in the case of the example in accordance with the line A that the ceramic 2 with a thickness of 0.15 mm, when using the thermal bimetallic strip TB 155/78, exactly compensates for the bending caused by the different thermal expansions.

The conventional elements in accordance with lines C and D have a decrease in curvature, i.e. a change b in the curvature downwards and therefore in the opposite direction to the direction R as the temperature rises, which differs according to their geometry—in the example illustrated according to the thicknesses of the materials used. The components produced in accordance with the invention, by contrast, as plotted by line A, reveals a positive change b in the curvature as the temperature changes or, as plotted by line B, a negative change b in the curvature as the temperature changes which is at least only very minor.

Measuring the electrical and mechanical properties revealed that the deflection of the component 1 according to the invention rises by approximately 20% and its rigidity rises by virtually 80% compared to the conventional element of identical dimensions.

I claim:

1. A flat multilayered component for use as an actuator or sensor, the flat multilayered component comprising:
   a layer of electrically activatable material;
   a passive middle layer disposed adjacent said layer of electrically activatable material;
   a further passive material layer disposed adjacent said passive middle layer, said passive middle layer having a higher coefficient of linear thermal expansion than both of said layer of electrically activatable material and said further passive material layer, wherein said layer of electrically activatable material has a first thickness and said further passive material layer has a second thickness, and wherein a ratio of the first thickness and the second thickness is such that about the same mechanical expansion occurs in said layer of electrically activatable material and said further passive material layer for a given change in an operating temperature of the flat multilayered component and
   wherein the passive middle layer and the further passive material layer are formed of metal.

2. The component according to claim 1, wherein said further passive material layer and said passive middle layer are inactive layers joined by a metallic bond.

3. The component according to claim 1, including a layer of metal disposed on said layer of electrically activatable material.

4. The component according to claim 1, wherein said layer of electrically activatable material has a structure formed of a plurality of sub-layers.

5. The component according to claim 1, wherein said layer of electrically activatable material is formed of a piezoceramic having at least one surface and a metal layer at least partially coating said at least one surface of said piezoceramic.

6. The component according to claim 1, wherein said layer of electrically activatable material is a piezoceramic.

7. The component according to claim 2, wherein said wherein said passive middle layer and said further passive material layer form a thermal bimetallic strip.

8. A flat multi-layered actuator, comprising:
   a piezoceramic layer having a plurality of sub-layers;
   a first thermal metallic layer disposed adjacent to the piezoceramic layer; and
   a second thermal metallic layer disposed adjacent the first thermal metallic layer, wherein the first thermal metallic layer has a higher coefficient of thermal expansion than each of the piezoceramic layer and the second thermal metallic layer, wherein said piezoceramic layer has a first thickness and said second thermal metallic layer has a second thickness, and wherein a ratio of the first thickness and the second thickness is such that about the same mechanical expansion occurs in said piezoceramic layer and said second thermal metallic layer for a given change in an operating temperature of the flat multilayered actuator.

9. The flat multi-layered actuator of claim 8, wherein an electrode is disposed on at least a portion of a top surface of the piezoceramic layer.

10. The flat multi-layered actuator of claim 8, wherein said first thermal metallic layer and said second thermal metallic layer form a thermal bimetallic strip.

11. A flat multilayered component for use as an actuator or sensor, the flat multilayered component comprising:
    a layer of electrically activatable material;
    a passive middle layer disposed adjacent said layer of electrically activatable material;
    a further passive material layer disposed on a side of the passive middle layer opposite the layer of electrically activatable material, said passive middle layer having a higher coefficient of linear thermal expansion than both of said layer of electrically activatable material and said further passive material layer; and
    wherein the layer of electrically activatable material and the further passive material layer are sized such that approximately the same mechanical expansion occurs in said layer of electrically activatable material as said further passive material layer for a given change in an operating temperature of the flat multilayered component; and
    wherein the further passive material layer is formed of metal.

12. The component according to claim 11, wherein the further passive material layer is adhesively bonded to the passive middle layer.

13. The component according to claim 11, wherein the further passive material layer is connected to the passive middle layer through a metallic bond.

14. The component according to claim 11, wherein the passive middle layer is formed with electrically conductive fibers.

15. The component according to claim 11, wherein said passive middle layer and said further passive material layer form a thermal bimetallic strip.

16. The component according to claim 11, including a layer of metal disposed on said layer of electrically activatable material.

17. The component according to claim 11, wherein said layer of electrically activatable material has a structure formed of a plurality of sub-layers.

18. The component according to claim 11, wherein said layer of electrically activatable material is formed of a piezoceramic having at least one surface and a metal layer at least partially coating said at least one surface of said piezoceramic.

19. The component according to claim 11, wherein said layer of electrically activatable material is a piezoceramic.

* * * * *